United States Patent
Bösmüller et al.

(10) Patent No.: US 7,995,367 B2
(45) Date of Patent: Aug. 9, 2011

(54) CIRCUIT ARRANGEMENT COMPRISING A NON-VOLATILE MEMORY CELL AND METHOD

(75) Inventors: Peter Bösmüller, Graz (AT); Johannes Fellner, Pirka (AT); Gregor Schatzberger, Graz (AT)

(73) Assignee: austriamicrosystems AG, Unterpremstätten (AT)

( * ) Notice: Subject to any disclaimer, the term of this patent is extended or adjusted under 35 U.S.C. 154(b) by 128 days.

(21) Appl. No.: 12/297,082

(22) PCT Filed: Apr. 12, 2007

(86) PCT No.: PCT/EP2007/003270
§ 371 (c)(1),
(2), (4) Date: May 19, 2009

(87) PCT Pub. No.: WO2007/118679
PCT Pub. Date: Oct. 25, 2007

(65) Prior Publication Data
US 2009/0219746 A1    Sep. 3, 2009

(30) Foreign Application Priority Data

Apr. 13, 2006 (DE) .......................... 10 2006 017 480

(51) Int. Cl.
*G11C 5/06* (2006.01)
*G11C 5/14* (2006.01)
*G11C 7/00* (2006.01)
*G11C 17/00* (2006.01)

(52) U.S. Cl. ....... 365/72; 365/63; 365/226; 365/189.06; 365/96

(58) Field of Classification Search ........................ None
See application file for complete search history.

(56) References Cited

U.S. PATENT DOCUMENTS

| 4,730,129 A |   | 3/1988 | Kunitoki et al. |
|---|---|---|---|
| 4,995,004 A | * | 2/1991 | Lee ........................... 365/189.11 |
| 5,334,880 A | * | 8/1994 | Abadeer et al. ............... 327/526 |
| 5,404,049 A |   | 4/1995 | Canada et al. |

(Continued)

FOREIGN PATENT DOCUMENTS
EP      1 195 771      4/2002

OTHER PUBLICATIONS

J. Fellner et al., "Lifetime Study for a Poly Fuse in a 0.35μM Polycide CMOS Process", 2005 IEEE International Reliability Physics Symposium Proceedings 43$^{rd}$ Annual, San Jose, California, Apr. 17-21, 2005, IEEE Catalog No. 05CH37616, ISBN: 0-7803-8803-8, Library of Congress No. 82-640313, pp. 446-449.

(Continued)

*Primary Examiner* — Hoai V Ho
*Assistant Examiner* — James G Norman
(74) *Attorney, Agent, or Firm* — Cohen Pontani Lieberman & Pavane LLP

(57) ABSTRACT

The circuit arrangement comprises a symmetrically constructed comparator (3), a non-volatile memory cell (10) and a reference element (20). The comparator (3) exhibits a latching function, and is connected in a differential current path that joins the power supply terminal (9) to a reference potential terminal (8). The non-volatile memory cell (10) is connected in a first branch (35) of the differential current path, and the reference element (20) is connected in a second branch (55) of the differential current path.

16 Claims, 4 Drawing Sheets

U.S. PATENT DOCUMENTS

| | | | |
|---|---|---|---|
| 5,418,487 A | 5/1995 | Armstrong, II | |
| 5,731,733 A | 3/1998 | Denham | |
| 5,976,943 A | 11/1999 | Manley et al. | |
| 6,091,273 A | 7/2000 | Bernstein et al. | |
| 6,384,664 B1 | 5/2002 | Hellums et al. | |
| 6,421,293 B1 | 7/2002 | Candelier et al. | |
| 6,487,134 B2 * | 11/2002 | Thoma et al. | 365/205 |
| 6,525,955 B1 | 2/2003 | Smith et al. | |
| 6,775,186 B1 | 8/2004 | Eshel | |
| 6,819,144 B2 | 11/2004 | Li et al. | |
| 2002/0008544 A1 * | 1/2002 | Lim et al. | 326/86 |
| 2002/0057604 A1 | 5/2002 | Khouri et al. | |
| 2004/0052106 A1 * | 3/2004 | Ohtani | 365/158 |
| 2004/0105301 A1 * | 6/2004 | Toyoda et al. | 365/154 |
| 2005/0212086 A1 | 9/2005 | Unterleitner | |

OTHER PUBLICATIONS

J. Fenner et al., "One Time Programming Cell Using More than Two Resistance Levels of a PolyFuse", Proceedings of the IEEE 2005 Custom Integrated Circuits Conference $27^{th}$ annual, San Jose, California, Sep. 18-21, 2005, IEEE Catalog No. 05CH37658, ISBN: 0-7803-9023-7, Library of Congress Catalog No. 85-653738, pp. 263-266.

* cited by examiner

CIRCUIT ARRANGEMENT COMPRISING A NON-VOLATILE MEMORY CELL AND METHOD

RELATED APPLICATIONS

This is a U.S. national stage under 35 USC §371 of application No. PCT/EP2007/003270, filed on Apr. 12, 2007.

This application claims the priority of German application no. 10 2006 017 480.1 filed Apr. 13, 2006, the entire content of which is hereby incorporated by reference.

FIELD OF THE INVENTION

The present invention concerns a circuit arrangement having a non-volatile storage cell, an application of the circuit arrangement, and a method for operating a non-volatile storage cell.

BACKGROUND OF THE INVENTION

Non-volatile storage cells are elements used widely for permanently storing data such as serial numbers, trim settings for analogue circuits, or the number of a semiconductor chip permanently in a semiconductor chip.

Documents U.S. Pat. No. 4,730,129, U.S. Pat. No. 5,404,049, U.S. Pat. No. 5,418,487, U.S. Pat. No. 5,731,733, U.S. Pat. No. 6,091,273, U.S. Pat. No. 6,384,664 B1 and U.S. Pat. No. 6,819,144 B2 describe circuit arrangements for operating non-volatile storage cells implemented in the form of a fuse.

Documents U.S. Pat. No. 6,421,293 B1 and U.S. Pat. No. 6,525,955 B1 disclose memory cells that can be programmed once only in which, during the programming, a parameter of an insulator is changed, together with an associated circuit arrangement.

Document US 2005/0212086 A1 describes an antifuse, implemented in the form of a Zener diode, which when programmed, exhibits a low value of resistance and, when not programmed, a high value of resistance.

The documents "Lifetime Study for a Polyfuse in a 0.35 µm Polycide CMOS Process", J. Fellner, P. Bösmuller, H. Reiter, 43rd Annual IEEE International Reliability Physics Symposium, Apr. 17-21, 2005, Conference Proceedings, pages 446-449, and "A One Time Programming Cell Using More than Two Resistance Levels of a polyFuse", J. Fellner, 27th Annual IEEE Custom Integrated Circuits Conference, Sep. 18-21, 2005, Conference Proceedings, pages 263-266, and U.S. Pat. No. 5,976,943 concern programmable resistors comprising two layers. The first layer precipitated onto the semiconductor chip comprises polysilicon, while the second layer deposited on the semiconductor chip comprises a silicide.

SUMMARY OF THE INVENTION

An object of the present invention is to provide a circuit arrangement with a non-volatile storage cell and a method for operating a non-volatile storage cell that permits accurate evaluation of the programming state of the non-volatile storage cell and an implementation of the circuit arrangement using only a small number of components.

According to an aspect of the invention, a circuit arrangement comprises a non-volatile storage cell, a reference element and a comparator. A differential current path connects a power supply terminal to a reference potential terminal. The comparator is symmetrically constructed, and is connected in the differential current path. The comparator features a latching function. The non-volatile storage cell is connected in a first branch of the differential current path, while the reference element is included in a second branch of the differential current path.

As a result of the different values of resistance of the reference element and of the non-volatile memory cell, different currents flow in the first and second branches of the differential current path. The different currents in the first and second branches are detected by means of the comparator. Due to the comparator's latching function, an output signal obtained in this way is made available at the comparator's output. The output signal is thus created depending on the value of the resistance of the non-volatile memory cell and of the value of the resistance of the reference element.

An advantage of the circuit arrangement is that, due to the integration of the comparator function and the latching function in one block, the cost of the required circuitry can be kept low. The comparator and the reference element advantageously permit the programming status of the non-volatile memory cell to be evaluated accurately.

In one embodiment, the comparator with latching function comprises a first and a second inverter. The first inverter couples a supply terminal of the first inverter with a reference potential terminal. Similarly, the second inverter couples a supply terminal of the second inverter with the reference potential terminal. The first inverter and the second inverter each have an input and an output. The input to the second inverter is connected to the output of the first inverter, while the output of the second inverter is connected to the input of the first inverter. Due to the different currents in the two branches of the differential current path, the two branches charge up at different rates. This difference is evaluated by the symmetrical comparator with a digital output signal. The feedback between the two inverters provides the latching function to the comparator's output signal.

In one embodiment, the non-volatile memory cell couples the power supply terminal with the supply terminal of the first inverter while the reference element couples the power supply terminal to the supply terminal of the second inverter. In one embodiment, the first inverter comprises a first and a second transistor, while the second inverter also comprises a first and a second transistor.

In a further development, a first load transistor couples the output of the first inverter to the reference potential terminal, while a second load transistor couples the output of the second inverter to the reference potential terminal. A control terminal of the first load transistor is coupled to a control terminal of the second load transistor. If the first and second load transistors are switched into a conductive state, the output of the first inverter and the output of the second inverter are at a low potential, approximately the reference potential. If, in a following step, the first and second load transistors are simultaneously switched off, the non-volatile memory cell and the reference element charge up the outputs of the two inverters. If the non-volatile storage cell exhibits a higher value of resistance than the reference element, a potential at the output of the second inverter rises more quickly than a potential at the output of the first inverter. On reaching the switching threshold of the second inverter, a high potential will be found at the output of the second inverter. Due to the connection of the output of the second inverter to the input of the first inverter, the first inverter will be driven in such a way that its output adopts a low potential. The opposite applies to the case in which the non-volatile memory cell has a low value of resistance in comparison with the reference element.

In one embodiment, the circuit arrangement comprises a write arrangement with a first switch that connects a first input of the write arrangement to the output of the first inverter, a second switch that connects a second input of the write arrangement to the output of the second inverter, and a control input that is connected to a control terminal of the first switch and to a control terminal of the second switch.

The non-volatile memory cell can be a mask-programmed memory cell. Alternatively the non-volatile memory cell can comprise an erasable programmable memory cell. In a further alternative embodiment, the non-volatile memory cell can be implemented as programmable memory cell that is a not erasable.

The non-volatile memory cell can be implemented in the form of a resistor, where a programming current irreversibly increases the value of the resistance of the non-volatile memory cell. Alternatively, the non-volatile memory cell can be a fuse that is programmed by means of a laser beam. The non-volatile memory cell advantageously is implemented as a fuse that comprises a resistor that is melted by a programming current. The non-volatile memory cell can comprise a metal resistor, a polysilicon resistor, or a combined polysilicon/silicide resistor.

In an alternative embodiment, the non-volatile memory cell can be implemented as an antifuse element, where the value of the resistance can be irreversibly reduced by means of a programming current. In one embodiment the antifuse element can be implemented as a diode, in particular as a Zener diode.

The reference element can be implemented as a resistor that exhibits a value of resistance that advantageously lies between the resistances of the non-volatile memory cell before and after programming.

The circuit arrangement can have a programming transistor connected between a terminal of the non-volatile memory cell and the reference potential terminal. A further terminal of the non-volatile memory cell is connected to the power supply terminal. If the programming transistor is switched to a conductive state, a high current flows through the non-volatile memory cell, setting a value of resistance of the non-volatile memory cell as a result of which the non-volatile memory cell is programmed.

In one embodiment, the circuit arrangement has a compensation element that is connected to a terminal of the reference element and is coupled to the second branch of the differential current path. The compensation element compensates for the capacitative loading that results from the programming transistor in the first branch of the differential current path. The compensation element advantageously can yield a symmetrical capacitative load at the supply terminals of the first and second inverters. In this way, the capacitative and resistive loads in the first and second branches of the current path advantageously are, apart from the resistance values of the non-volatile memory cell and of the reference element, approximately equal.

The circuit arrangement can be implemented on a semiconductor chip. The circuit arrangement can be implemented in integrated bipolar technology, and can comprise transistors that are implemented as bipolar transistors. It advantageously can be manufactured in a complementary metal oxide semiconductor integration technology, comprising transistors that are implemented as field effect transistors.

The circuit arrangement can be used for permanent data storage. The data can comprise a serial number or of an identification number for the semiconductor chip. Alternatively, the circuit arrangement can be employed to store a trim setting for an analogue circuit, in particular for an analogue/digital or a digital/analogue converter. It can be used to repair a random access memory (RAM) by connecting redundant lines or columns in the place of defective lines or columns.

According to an aspect of the invention, a method for the operation of a non-volatile memory cell comprises the following steps. A power supply voltage is provided. An output signal and an inverted output signal are set and latched depending on a resistance value of a non-volatile memory cell and on a resistance value of a reference element. The non-volatile memory cell is connected in a first branch of a differential current path, while the reference element is connected in a second branch. The differential current path flows through a comparator.

The comparator and the reference element advantageously facilitate accurate reading of the information stored in the non-volatile memory cell.

BRIEF DESCRIPTION OF THE DRAWINGS

The invention is explained below in more detail using several examples of embodiments. Components having the same function or effects bear the same reference numbers. When the functions of parts of the circuit or components correspond to one another, their description is not repeated for every one of the following figures.

DETAILED DESCRIPTION OF THE DRAWINGS

Figure 1:
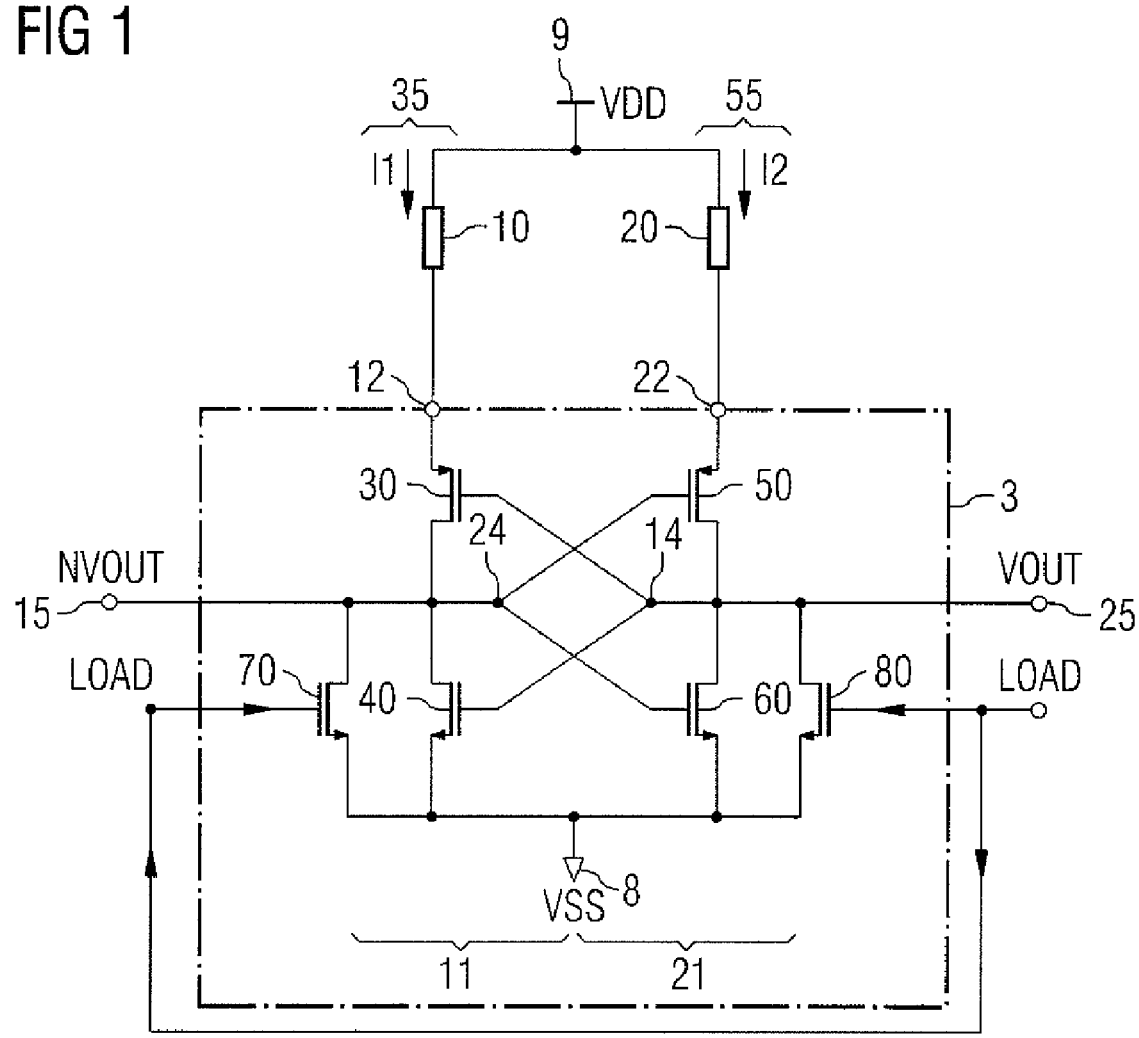
FIG. 1 illustrates an example of an embodiment of a circuit arrangement with a non-volatile memory cell according to the invention.

FIG. 1 illustrates an example of an embodiment of the circuit arrangement with a non-volatile memory cell 10. The circuit arrangement comprises a first branch 35 and a second branch 55 that are connected between a power supply terminal 9 and a reference potential terminal 8. The first and second branches 35, 55 together comprise a differential current path of a comparator 3. The comparator 3 comprises a first inverter 11 and a second inverter 21. The first inverter 11 is located in the first branch 35 and the second inverter 21 in the second branch 55. The first inverter 11 is connected between a supply terminal 12 of the first inverter 11 and the reference potential terminal 8, and comprises a first transistor 30 and a second transistor 40 that are connected in series with one another. The inputs of the transistors 30, 40, are connected to an input 14 of the first inverter 11. A circuit node accessible between the first and second transistors 30, 40 of the first inverter 11 forms an output 15 of the first inverter 11. Similarly, the second inverter 21 comprises a first transistor 50 and a second transistor 60 connected between a supply terminal 22 of the second inverter 21 and the reference potential terminal 8. The inputs of the two transistors 50, 60 of the second inverter 21 are connected to an input 24 of the second inverter 21. A node between the first and second transistors 50, 60 of the second inverter 21 provides an output 25 for the second inverter 21. The output 15 of the first inverter 11 is connected to the input 24 of the second inverter 21, while the output 25 of the second inverter 21 is connected to the input 14 of the first inverter 11. The output 15 of the first inverter 11 is coupled through a first load transistor 70 to the reference potential terminal 8, while the output 25 of the second inverter 21 is connected to it through a second load transistor 80. The inputs of the first and second load transistors 70, 80 are connected together.

A power supply voltage VDD is connected to the power supply terminal 9. A load signal, LOAD, can be supplied to the control terminals of the first and second load transistors 70, 80. In a first operating state, the first and second load transistors 70, 80, are switched into a conductive state. The first transistor 30 of the first inverter 11 and the first transistor 50 of the second inverter 21 are thus conductive, and the second transistor 40 of the first inverter 11 and the second transistor 60 of the second inverter 21 are switched into a non-conductive state. In the two branches 35, 55 of the differential current path, the differing resistances of the non-volatile memory cell 10 and of the reference element 20 cause currents I1, I2 of different magnitudes to flow, which give rise to different potentials at the supply terminals 12 and 22. If the two load transistors 70, 80 are switched into a non-conductive state, the comparator 3 detects the difference in voltage between the two supply terminals 12, 22, and latches the results into the two inverters 11, 21.

If the value of the resistance of the non-volatile memory cell 10 is lower than that of the reference element 20, the inverted output voltage NVOUT will rise more quickly than the output voltage VOUT, so that, as a result of the feedback between the first and second inverters 11, 21, the second transistor 60 of the second inverter 21 and the first transistor 30 of the first inverter 11 will be conductive, while the two other transistors 50, 40 will be switched into a non-conductive state. An inverted output signal NVOUT is available at the output 15 of the first inverter 11, while an output signal VOUT is available at the output 25 of the second inverter 21.

In this way a state of the non-volatile memory cell 10 can advantageously be detected and an output signal VOUT can be latched using few components.

Figure 2:
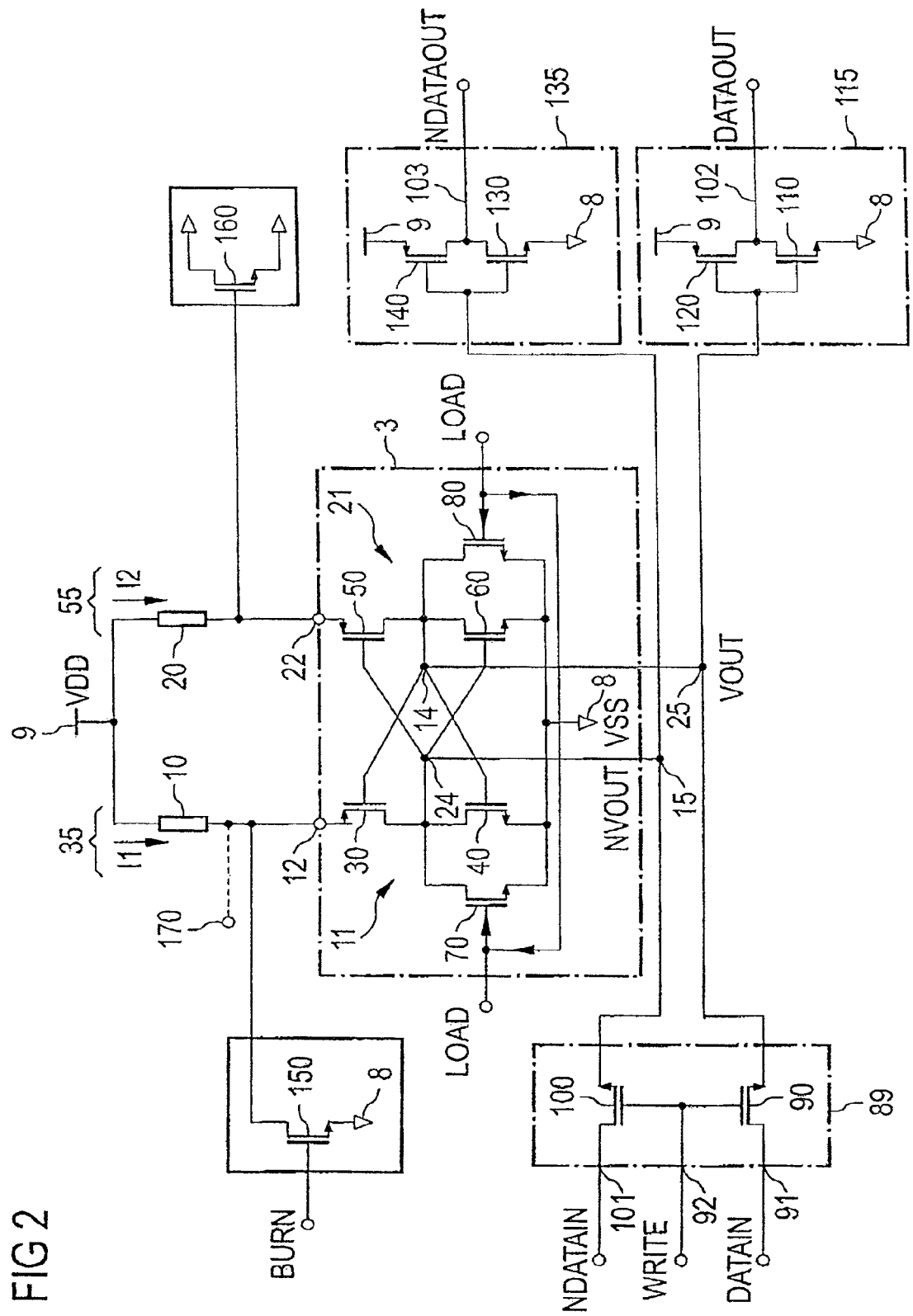
FIG. 2 illustrates an example of a further development of the circuit arrangement with a non-volatile memory cell according to the invention.

FIG. 2 illustrates an example of a further development of the embodiment of a circuit arrangement with a non-volatile memory cell shown in FIG. 1. In addition to the circuit arrangement according to FIG. 1, the circuit arrangement in FIG. 2 has a programming transistor 150 that connects the supply terminal 12 of the first inverter 11 to the reference potential terminal 8. In addition, a compensation element 160 is connected to the supply terminal 22 of the second inverter 21. The compensation element 160 is implemented as a transistor.

A first buffer 135 is connected to the output 15 of the first inverter 11, while a second buffer 115 is connected to the output 25 of the second inverter 21. The first buffer 135 comprises an inverter, comprising a first and a second transistor 140, 130, and is connected between the power supply terminal 9 and the reference potential terminal 8. Similarly, the second buffer 115 comprises an inverter, comprising a transistor 120 and a transistor 110, and is connected between the reference potential terminal 8 and the power supply terminal 9. The inputs to the two transistors 130, 140 of the first buffer 135 are connected to the output 15 of the first inverter 11, while the inputs of the transistors 120, 110 of the second buffer 115 are connected to the output 25 of the second inverter 21.

A first switch 100 of a write arrangement 89 precedes the output 15 of the first inverter 11. Similarly, the output 25 of the second inverter 21 is preceded by a second switch 90 of the write arrangement 89. The control terminals of the first and second switches 90, 100 are connected together and to a control input 92 of the write arrangement 89.

The transistors 30, 40, 50, 60, 70, 80, 110, 120, 130, 140, 150, 160 and the switches 90, 100 can be implemented as field-effect transistors, in particular as metal oxide semiconductor field effect transistors, or MOSFETs.

The programming transistor 150 serves to provide a first current I1 with a high value that flows through the non-volatile memory cell 10 in order to perform programming of the cell 10. A non-volatile memory cell is in a first state after production and is in a second state after a programming operation. In case the non-volatile memory cell is a resistor or a fuse, the non-volatile memory cell has a low resistance value in the first state and a high resistance value in the second state. The programming operation can be performed by providing a current with a high value which flows through the non-volatile memory cell. The current heats the non-volatile memory cell. The heat either destroys the conductive path in the memory cell or at least changes the memory cell in such a way that the resistance of the memory cell is increased. FIG. 3 shows an embodiment of such a non-volatile memory cell. Alternatively, the programming operation can be performed by providing a laser beam which cuts through the non-volatile memory cell. In case the non-volatile memory cell is an antifuse, the non-volatile memory cell has a high resistance value in the first state and a low resistance value in the second state. The programming operation can be performed by providing a current with a high value which flows through the non-volatile memory cell. FIG. 4 shows an embodiment of such a non-volatile memory cell.

Due to its size, the programming transistor 150 presents a capacitative load to the supply terminal 12. In the read process described above, the two branches 35, 55 of the differential current path are advantageously capacitatively loaded to the same extent, in order to ensure that the comparator 3 is symmetrical. For this purpose, the supply terminal 22 of the second inverter 21 is connected to the compensation element 160. This compensation element 160 is implemented as a transistor, and presents the same capacitive load to the second branch 55 of the differential current path as does the programming transistor 150 to the first branch 35 of the differential current path.

A buffer 115, 135 advantageously follows each of the two outputs 15, 25 of the first and second inverters 11, 21, so that a capacitative load at the output 15 of the first inverter 11, and a capacitative load at the output 25 of the second inverter 21 are approximately equal, and can not be changed by circuitry, not illustrated in FIG. 2, that may be connected to the outputs of the first and second inverters 11, 21. As a result, subsequent circuitry does not affect the setting and changeover process in the first and second inverters 11, 21.

The first and second branches 35, 55 advantageously are symmetrical in structure apart from the non-volatile memory cell 10 and the reference element 20. The loading of the outputs 15, 25 by the first and second buffers 115, 135, is symmetrical. Any effect of the programming transistor 150 on the first branch 35 is balanced by the effect of the compensation element 160 on the second branch 55. In this way, the circuit arrangement can be given a symmetrical structure. After the two load transistors 70, 80, have switched from the conductive to the non-conductive operating state, the symmetrical structure of the circuit arrangement ensures that the output signals VOUT, NVOUT advantageously depend exclusively on the state of the non-volatile memory cell 10 and on the reference element 20.

By means of the write arrangement 89 the output signal VOUT advantageously can be driven to the value of the setting signal DATAIN, and the inverted output signal NVOUT to the value of the inverted setting signal NDATAIN, as soon as a write control signal WRITE has switched the two switches 90, 100 into a conductive state. It is therefore advantageously possible for data to be stored in the two inverters 11 and 21 in a second manner, provided the non-volatile memory cell 10 is not of low resistance. In this way, data can be stored for test purposes independently of the non-volatile memory cell 10. Even before programming the non-volatile memory cell 10, the write arrangement 89 can set the buffered output voltages DATAOUT, NDATAOUT. It is possible, for instance, for a circuit to first be set and tested using the buffered output voltages DATAOUT, NDATAOUT before the setting is fixed by programming the non-volatile memory cell 10. A circuit of this type can, for instance, be a bandgap reference circuit.

It is also possible to use the write arrangement 89 even after the non-volatile memory cell 10 has been programmed to set the buffered output voltages DATAOUT, NDATAOUT, and thereby to override the information in the non-volatile memory cell 10. In this way, for instance, a region of memory that has been blocked by the circuit arrangement can be made accessible once more.

If the non-volatile memory cell 10 is programmable by means of a laser beam, then in an alternative embodiment, the programming transistor 150 and the compensation element 160 can be omitted.

In an alternative embodiment, a programming terminal 170, drawn dotted, can be connected in the place of the programming transistor 150 to the supply terminal 12 of the first inverter 11. The programming terminal 170 can be implemented as a terminal that can be accessed from outside, i.e. a pad. If a voltage below the supply voltage VDD is applied to the programming terminal 170, the first current I1 can flow with a high value. The non-volatile memory cell 10 can be programmed by this current I1.

Figure 3A:
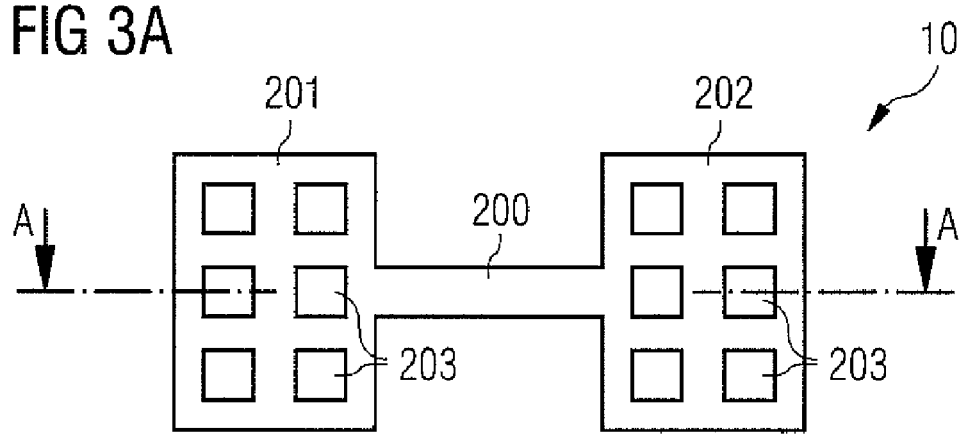
FIGS. 3a to 3c illustrate an example of an embodiment of a non-volatile memory cell that is implemented as a fuse.
Figure 3B:
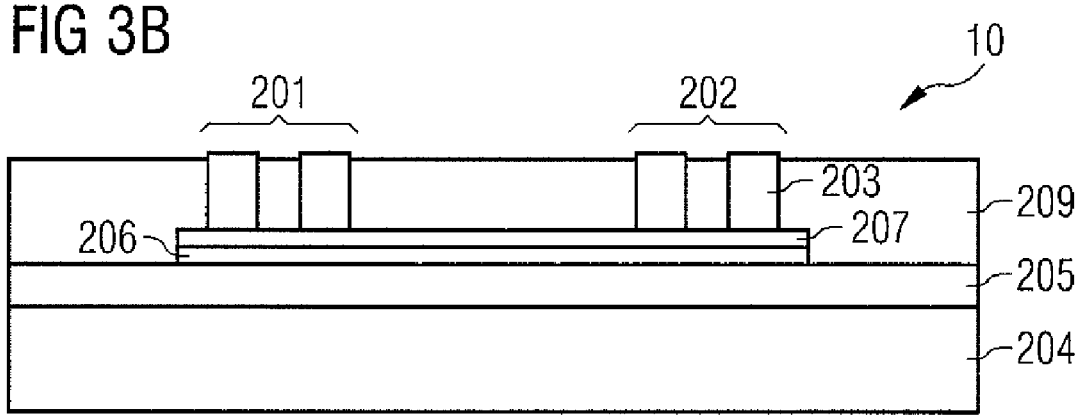
Figure 3C:
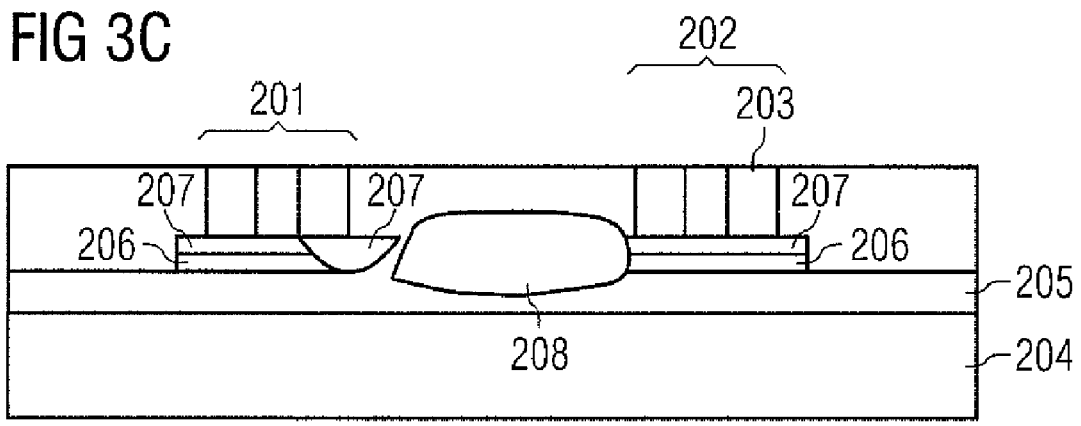
Figure 4:
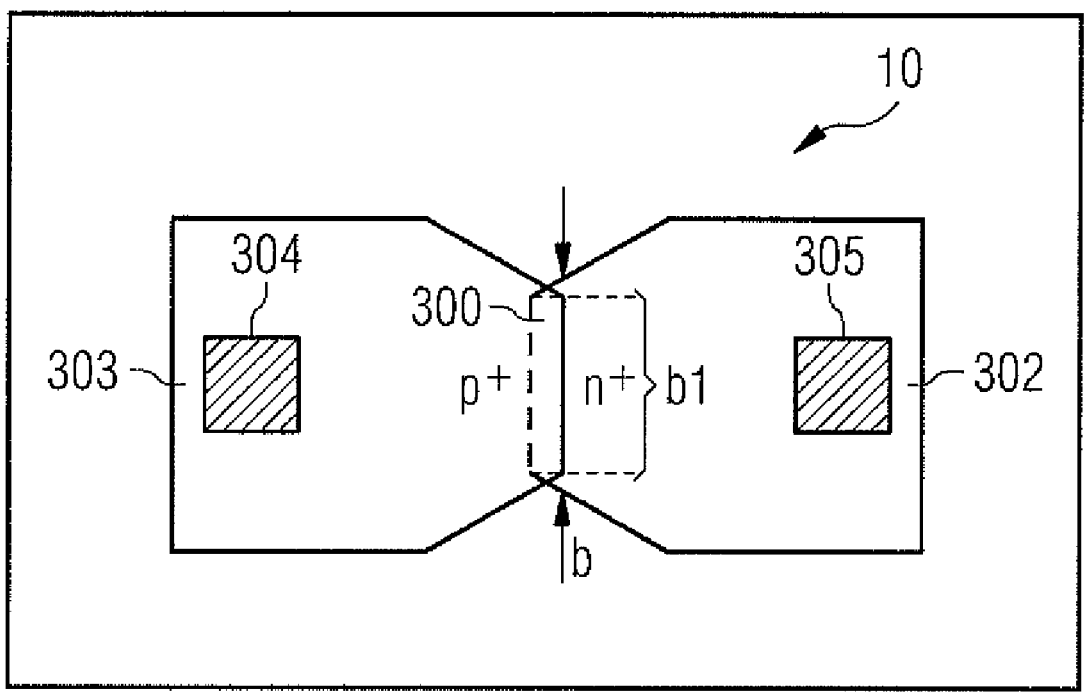
FIG. 4 illustrates an example of an embodiment of a non-volatile memory cell that is implemented as an antifuse.

FIGS. 3A to 3C illustrate an example of an embodiment of a non-volatile memory cell 10 that is implemented as a fuse. The non-volatile memory cell 10 is realized as a polyfuse.

FIG. 3A shows an example of a view from above of the non-volatile memory cell 10. It comprises a central region 200 as well as a first and a second terminal 201, 202 that are connected together through the central region 200. The first and second terminals 201, 202 each have several contacts 203.

FIG. 3B illustrates a cross-section through the non-volatile memory cell 10 whose layout is drawn in FIG. 3A. The non-volatile memory cell 10 is located on an insulating layer 205 that is itself implemented on a carrier 204. The central region 200 has a double layer comprising a polysilicon layer 206 and a silicide layer 207. The polysilicon layer 206 is deposited on the insulating layer 205, while the silicide layer 207 is deposited on the polysilicon layer 206. The contacts 203 are connected to the silicide layer 207. FIG. 3B illustrates the non-volatile memory cell 10 prior to programming.

FIG. 3C shows the non-volatile memory cell 10 after it has been programmed with a sufficiently high value of the programming current. The silicide material 207 which is located in the central region 200 between the first terminal 201 and the second terminal 202 before programming is primarily located at the first terminal 201 after programming. The original polysilicon layer 206 and the silicide layer 207 have separated. The remainder has become a polymorphic silicon layer 208 that has merged with the insulator 205 and the insulating layer 209. The value of the resistance of the non-volatile memory cell 10 as shown in FIG. 3C is in the range of megohms.

FIG. 4 illustrates a further example of an embodiment of a non-volatile memory cell 10 that has been implemented as an antifuse and that comprises a diode. The diode is implemented as a Zener diode. FIG. 4 shows the non-volatile memory cell 10 from above. It comprises oppositely doped regions 302, 303 that create a lateral p-n transition in a contact region 300. The region 302 is n-doped, while the region 303 is p-doped. Terminals 304, 305 are positioned on the two doped regions 302, 303. The non-volatile memory cell 10 can be programmed by means of a first current I1. Before programming, the diode has a high resistance value and a relatively low leakage current, whereas after programming it has a low value of resistance and passes a high current. When programmed, the diode can behave similarly to a resistor.

The scope of protection of the invention is not limited to the examples given hereinabove. The invention is embodied in each novel characteristic and each combination of characteristics, which includes every combination of any features which are stated in the claims, even if this feature or combination of features is not explicitly stated in the examples.

The invention claimed is:

1. A circuit arrangement with a non-volatile memory cell, comprising:
   a symmetrically constructed comparator having a latching function, the comparator being connected in a differential current path that joins a power supply terminal to a reference potential terminal, wherein said comparator comprises:
      a first inverter, comprising an input and an output, connected between a supply terminal of the first inverter and the reference potential terminal, and
      a second inverter having an input that is connected to the output of the first inverter, and an output that is connected to the input of first inverter, and which is connected between a supply terminal of the second inverter and the reference potential terminal;
   the non-volatile memory cell is being connected between the supply terminal of the first inverter and the power supply terminal;
   a reference element connected between the supply terminal of the second inverter and the power supply terminal;
   a write arrangement comprising:
      a first switch that couples a first input of the write arrangement to the output of the first inverter,
      a second switch that couples the second input of the write arrangement to the output of the second inverter, and
      a control input that is coupled to a control terminal of the first switch and to a control terminal of the second switch;
   a first load transistor coupled between the output of the first inverter and the reference potential terminal; and
   a second load transistor coupled between the output of the second inverter and the reference potential terminal, and which has a control terminal coupled to a control terminal of the first load transistor.

2. The circuit arrangement according to claim 1, wherein the first inverter comprises:
   a first transistor having a first terminal coupled to the reference potential terminal and a control terminal coupled to the input of the first inverter, and
   a second transistor having a first terminal coupled to the supply terminal of the first inverter, a control terminal coupled to the input of the first inverter, and a second terminal coupled to a second terminal of the first transistor of the first inverter and to the output of the first inverter.

3. The circuit arrangement according to claim 1, wherein the second inverter comprises:
   a first transistor having a first terminal coupled to the reference potential terminal and a control terminal coupled to the input of the second inverter, and
   a second transistor having a first terminal coupled to the supply terminal of the second inverter, a control terminal coupled to the input of the second inverter, and a second terminal coupled to a second terminal of the first transistor of the second inverter and to the output of the second inverter.

4. The circuit arrangement according to claim 1, wherein the circuit arrangement comprises:
a first buffer that follows the output of the first inverter, and
a second buffer that follows the output of the second inverter.

5. The arrangement according to claim 1, wherein the non-volatile memory cell is implemented as an irreversibly programmable memory cell.

6. The circuit arrangement according to claim 1, wherein the non-volatile memory cell is implemented as a resistor, the value of whose resistance can be irreversibly increased by a programming current.

7. The circuit arrangement according to claim 1, wherein the non-volatile memory cell is implemented as a fuse that can be melted by a programming current.

8. The circuit arrangement according to claim 1, wherein the non-volatile memory cell is implemented as an antifuse, the resistance value of which can be irreversibly lowered by means of a programming current.

9. The circuit arrangement according to claim 1, wherein the reference element is implemented as a resistor.

10. The circuit arrangement according to claim 1, wherein the circuit arrangement comprises:
a programming transistor that couples a terminal of the non-volatile memory cell to the reference potential terminal, and
a compensation element that is connected to a terminal of the reference element in order to present symmetrical capacitative loading to the supply terminals of the first and second inverters.

11. A data-storage device comprising the circuit arrangement according to claim 1, for the permanent storage of a serial number, a semiconductor chip number, and/or the trim setting of an analog circuit on a semiconductor chip that comprises the circuit arrangement.

12. A method for the operation of a non-volatile memory chip, comprising the steps of:
providing a power supply voltage;
setting and latching an output signal with a value of 1 and of an inverted output signal with a value of 0 in a case in which a non-volatile memory cell has a higher value of resistance than a reference element;
setting and latching the output signal with a value of 0 and of the inverted output signal with a value of 1 in a case in which the non-volatile memory cell has a lower value of resistance than the reference element, wherein a first current flows through the non-volatile memory cell and a first branch of the differential current path of a comparator, and a second current flows through the reference element and a second branch of the differential current path;
setting the output signal and the inverting output signal by overwriting the output signal by a setting signal, and the inverted output signal by an inverted setting signal; and
programming the non-volatile memory cell by driving a programming transistor with a programming signal such that a programming current generated by the power supply voltage flows through the non-volatile memory cell and through the programming transistor that is connected in series with the non-volatile memory cell;
wherein a compensation element is connected to a terminal of the reference element and presents a same capacitive load to the second branch of the differential current path and the programming transistor presents a same capacitive load to the first branch of the differential current path.

13. The method according to claim 12, comprising:
supplying a load signal with a first value to lower the output signal and the inverted output signal;
supplying the load signal with a second value, different from the first value, to load a first output of the comparator, with a consequential rise in the output signal depending on the reference element, and loading a second output of the comparator with a consequential rise of the inverted output signal depending on the non-volatile memory cell; and
comparing the output signal with the inverted output signal, providing the output signal and the inverted output signal depending on a result of the comparison.

14. The method according to claim 12, comprising separate buffering of the output signal and of the inverted output signal.

15. The circuit arrangement according to claim 1, wherein said first inverter is located in the first branch, and said second inverter is located in the second branch of the differential current path.

16. A circuit arrangement with a non-volatile memory cell, comprising:
a symmetrically constructed comparator having a latching function, the comparator being connected in a differential current path that joins a power supply terminal to a reference potential terminal, wherein said comparator comprises:
a first inverter, comprising an input and an output, connected between a supply terminal of the first inverter and the reference potential terminal, and
a second inverter having an input that is connected to the output of the first inverter, and an output that is connected to the input of first inverter, and which is connected between a supply terminal of the second inverter and the reference potential terminal;
the non-volatile memory cell being connected in the first branch of the differential current path;
a reference element, connected in the second branch of the differential current path;
a write arrangement comprising:
a first switch that couples a first input of the write arrangement to the output of the first inverter,
a second switch that couples the second input of the write arrangement to the output of the second inverter, and
a control input that is coupled to a control terminal of the first switch and to a control terminal of the second switch;
a programming transistor that couples a terminal of the non-volatile memory cell to the reference potential terminal; and
a compensation element connected to a terminal of the reference element to present symmetrical capacitive loading to the supply terminals of the first and second inverters.

* * * * *